(12) United States Patent
Chu

(10) Patent No.: US 6,998,534 B1
(45) Date of Patent: Feb. 14, 2006

(54) PARTITION STRUCTURE OF A COMPUTER CASING

(75) Inventor: Yen-Lin Chu, Taipei (TW)

(73) Assignee: Asia Vital Component Co., LTD, Kaohsiung (TW)

( * ) Notice: Subject to any disclaimer, the term of this patent is extended or adjusted under 35 U.S.C. 154(b) by 0 days.

(21) Appl. No.: 10/968,113

(22) Filed: Oct. 20, 2004

(51) Int. Cl.
 *H02B 1/30* (2006.01)
(52) U.S. Cl. .................. 174/61; 174/50; 174/52.1; 174/17 R; 361/690; 361/694; 361/695; 361/380; 361/788; 361/683; 361/684; 361/685; 361/686
(58) Field of Classification Search ........... 174/61, 174/50, 52.1, 17 R; 361/690, 694, 695, 380, 361/788, 683, 684, 685, 686
See application file for complete search history.

(56) References Cited

U.S. PATENT DOCUMENTS

| 5,031,070 | A * | 7/1991 | Hsu ........................... 361/683 |
| 6,459,589 | B1 * | 10/2002 | Manweiler et al. ......... 361/752 |

* cited by examiner

*Primary Examiner*—Dean A. Reichard
*Assistant Examiner*—Anton Harris

(57) ABSTRACT

A partition structure of in a computer casing provides a partition with two guide grooves and a joining member with two engaging parts corresponding to the guide grooves respectively. Each of the guide grooves has an upper opening, a locating part and a lower opening respectively for engaging with engaging parts of the joining member. One of the guide grooves is shorter and the upper opening and the lower opening 322c are wider than rest part in the respective guide groove for facilitating the joining member 23 being assembled to or disassembled from the partition 32 handily.

2 Claims, 19 Drawing Sheets

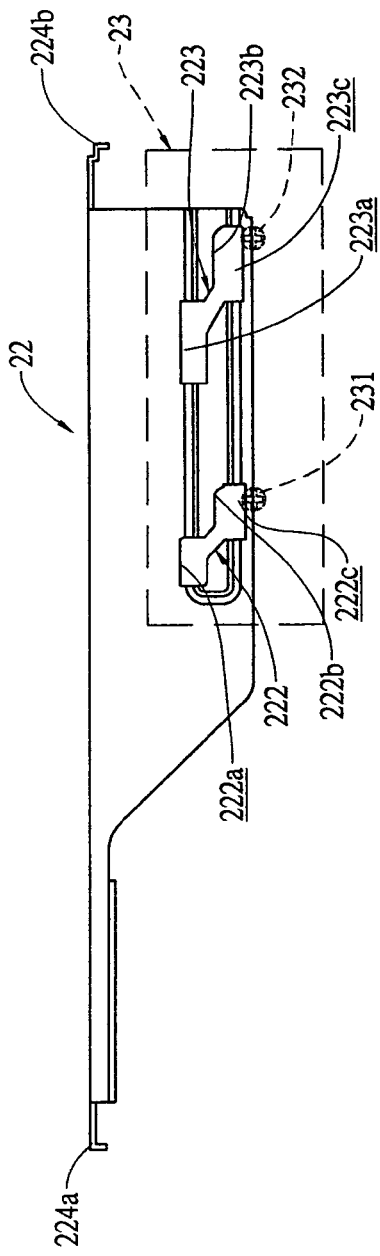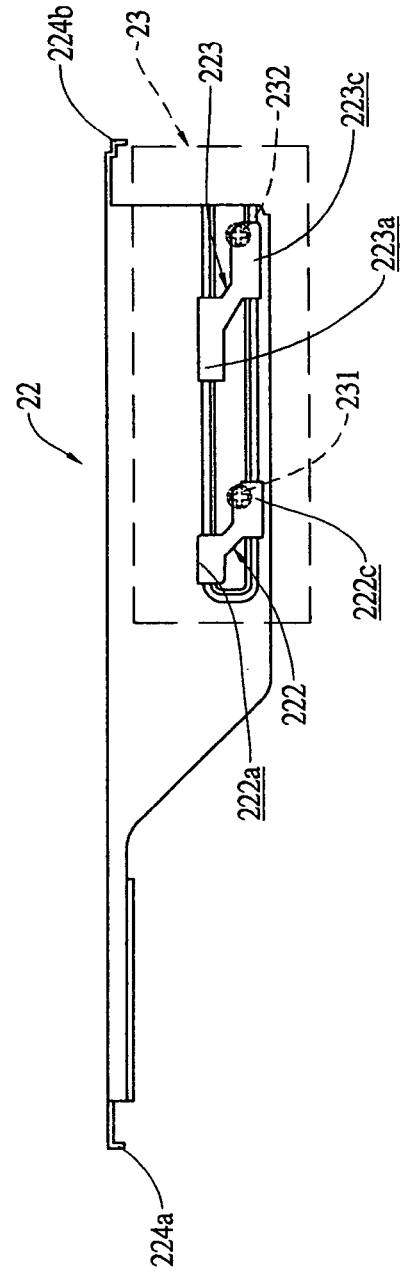

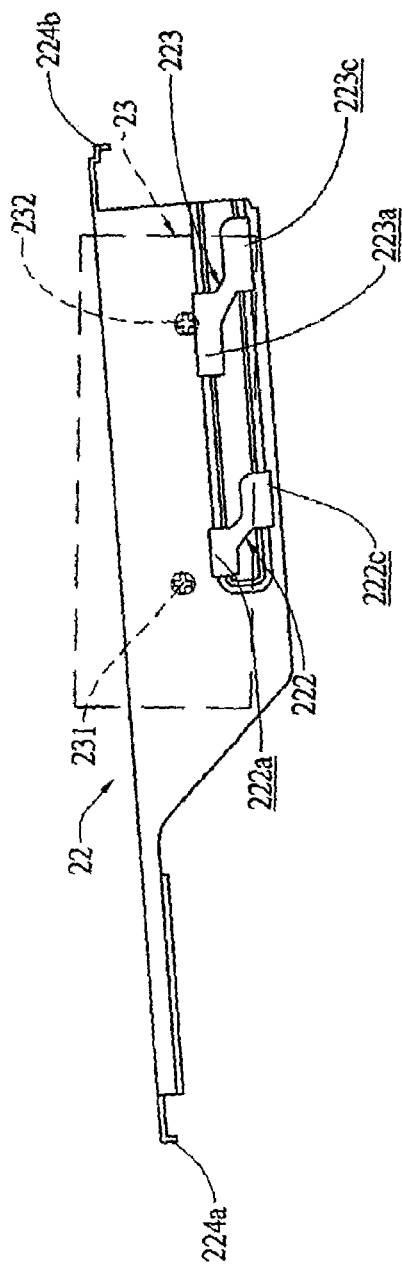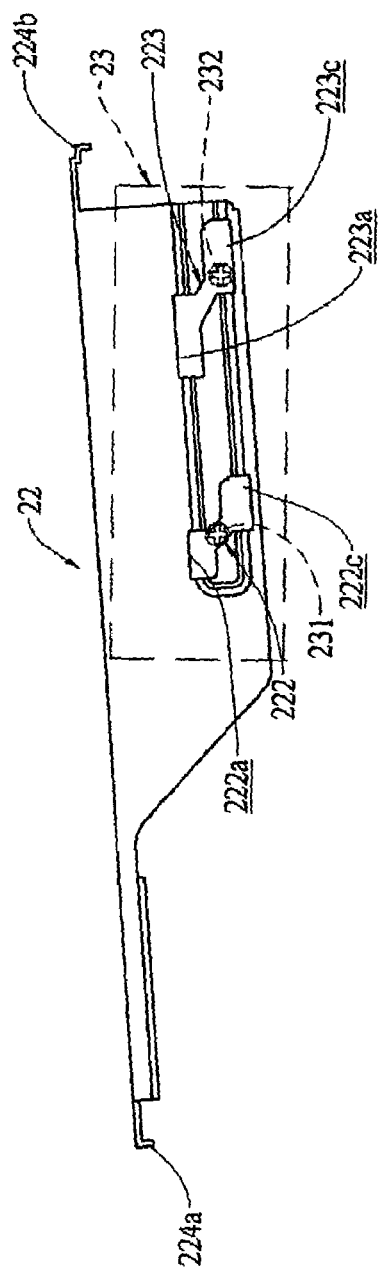

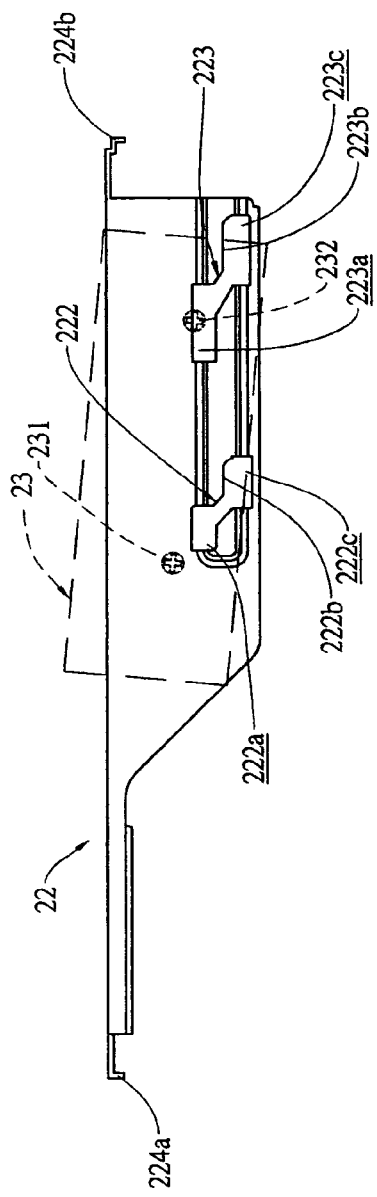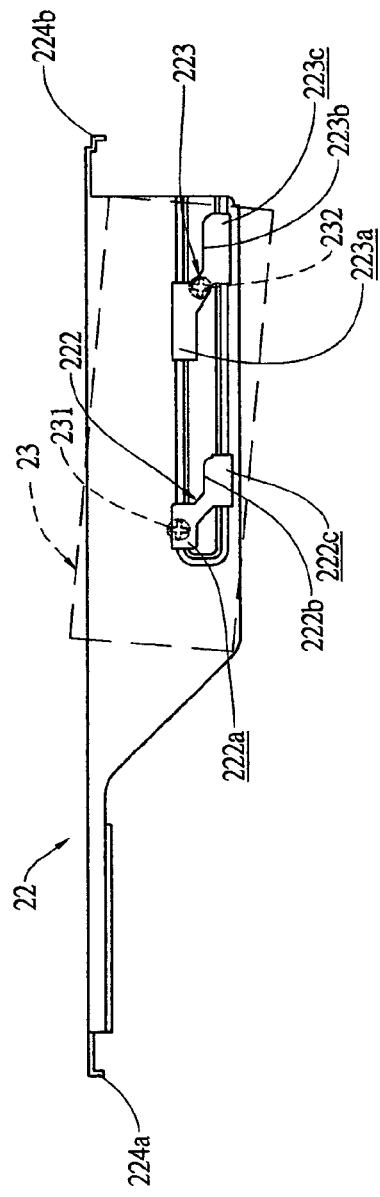

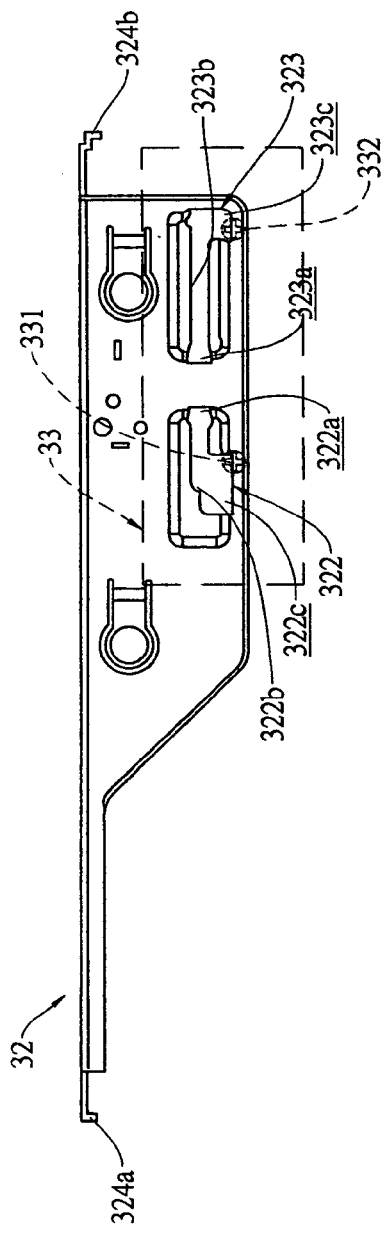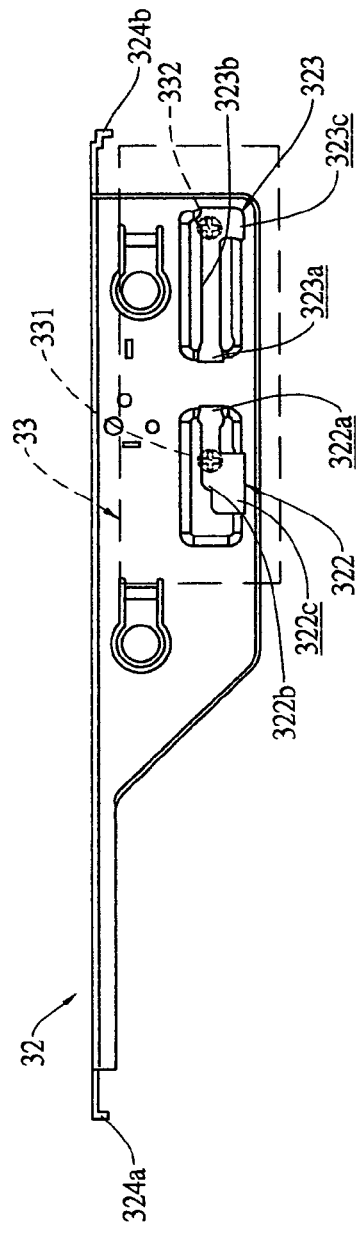

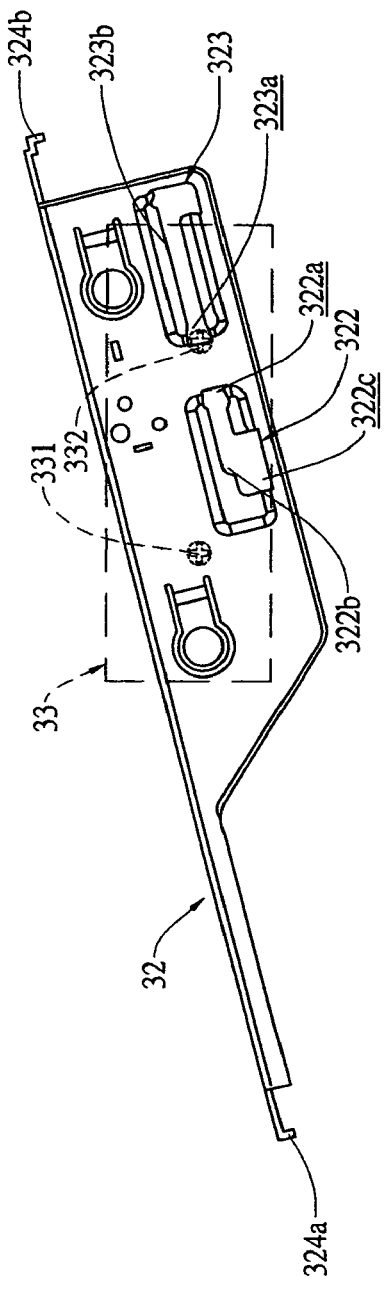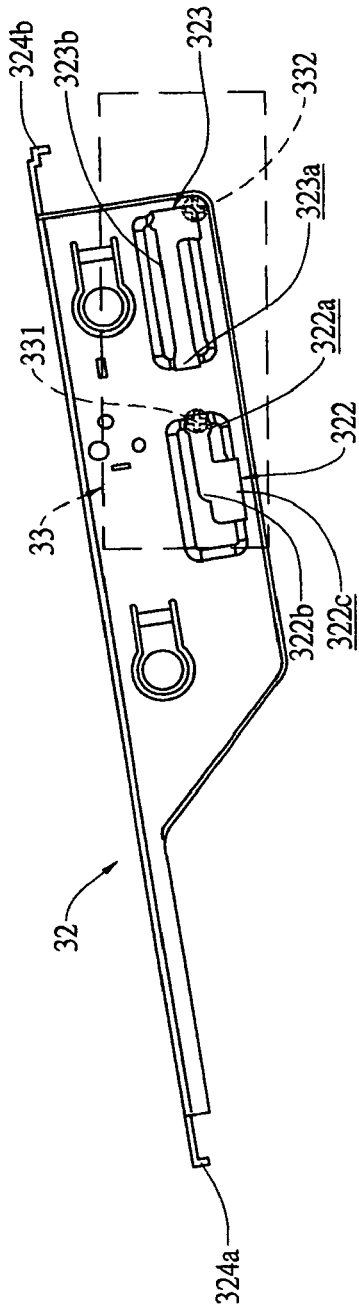

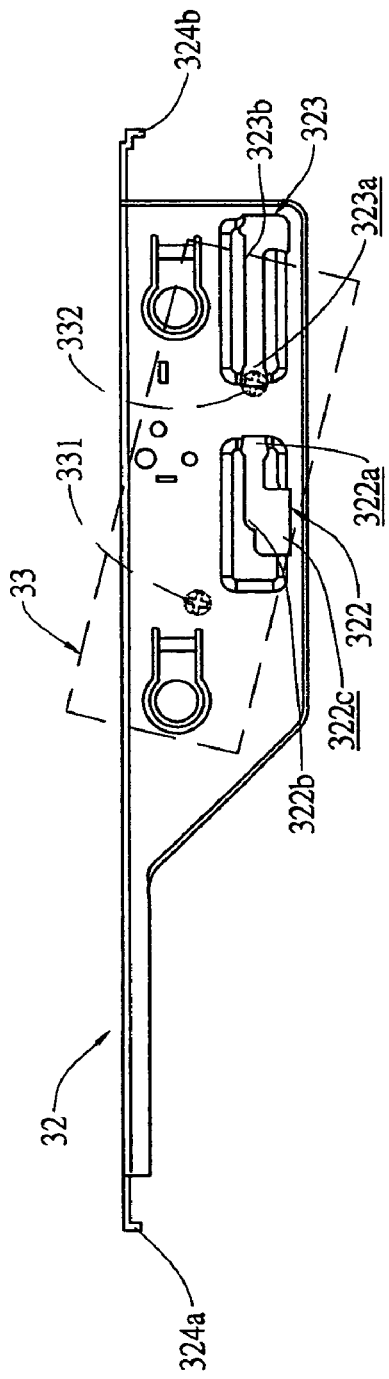
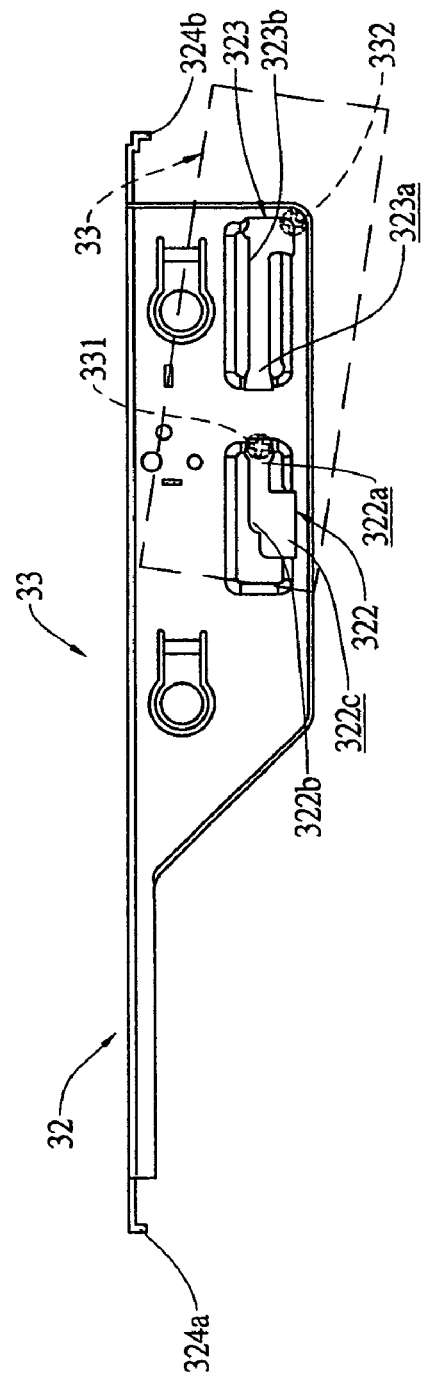
FIG 22
FIG 23

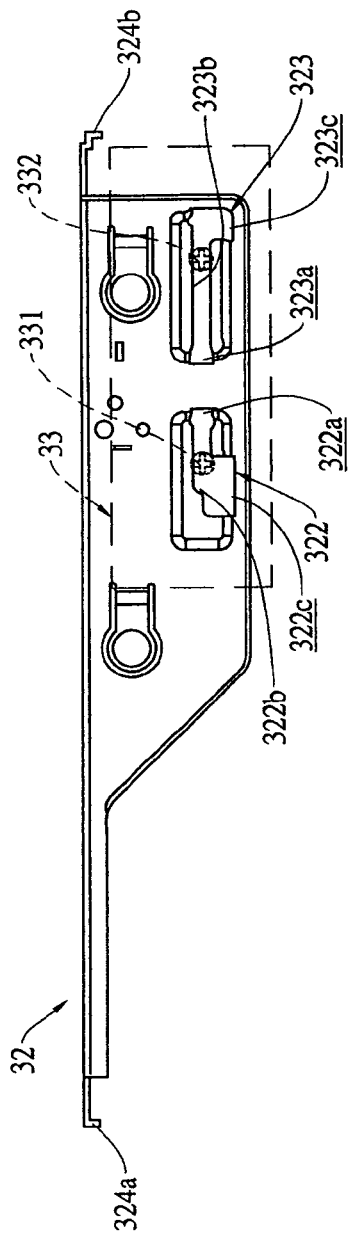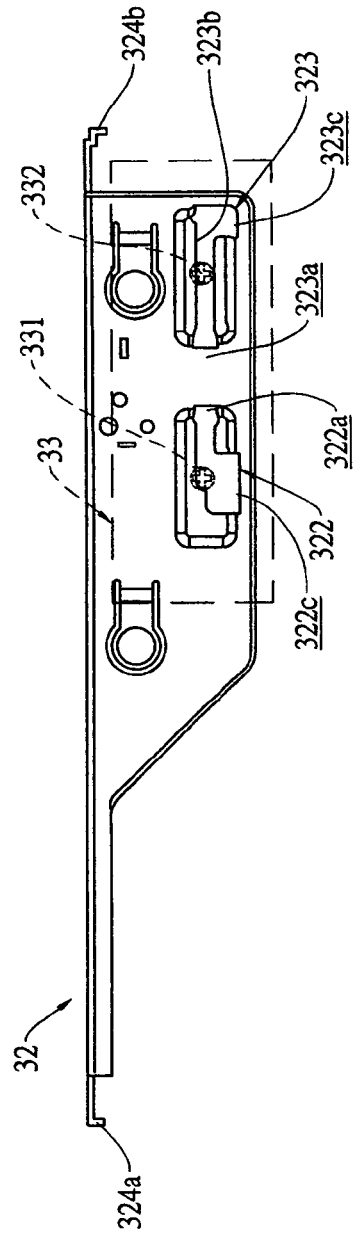

PARTITION STRUCTURE OF A COMPUTER CASING

BACKGROUND OF THE INVENTION

1. Field of the Invention:

The present invention is related to a partition structure of a computer casing, and particularly to a partition, which is provided with guide groove, so as to be engaged to the engaging parts of the joining member in a computer casing.

2. Brief Description of the Related Art

Referring to FIG. 1, a conventional computer casing 11 is attached with a partition 2 and a joining member 13. The computer casing 11 has a fixing part 111 with a locating slot 111$a$ and fixing holes 111$b$. The partition 12 has perforations 121 and the fasteners 121$a$ can pass through the perforations 121 to engage with the fixing holes 111$b$. Thus, the partition 12 is capable of being fixedly attached to the computer casing 11 via the fasteners 121$a$.

The partition 12 has a first guide groove 122 and a second guide groove 123. The first guide groove 122 further has a guide part 122$a$ and a locating part 122$b$ and the second guide groove 123 further has a guide part 123$a$ and a locating part 123$b$. Thus, the joining member 13, which is provided with engaging parts 131, 132, engages with the locating parts 122$b$, 123$b$ via the guide part 122$a$ of the first guide groove 122 and the guide part 123$a$ of the second guide groove 223.

Referring to FIGS. 2 to 4, while in assembling, the joining member 13 is tilted an angle first to allow the engaging part 132 of the joining member 13 enters via the guide part 123$a$ of the second guide groove 123. Then, the engaging part 131 of the joining member 13 enters via the guide part 122$a$ of the first guide groove 122 as shown in FIG. 2. Next, the engaging parts 131, 132 slide along the first guide groove 122 and the second guide groove 123$a$ shown in FIG. 3 till the engaging parts 131, 132 reaching the locating parts 122$b$, 123$b$ as shown in FIG. 4.

Referring to FIG. 5, the assembly of the partition 12 and the joining member 13 is attached to the computer casing 11 with the projections 124 at both end sides of the partition 12 insert into the locating slots 111$a$ next to the fixing holes 111$b$. Further, the perforations 121 of the partition 12 align with the fixing holes 111$b$ of the computer casing 11 and the fasteners 121$a$ pass through the perforations 121 to engage with the fixing holes 111$b$. Thus, the partition 12 is fixedly attached to the computer casing 11.

During disassembling of the computer casing, the fasteners 121$a$ have to be detached first. Then, the partition 12 with the joining member 13 is detached from the computer casing 11. Finally, the partition 12 is disengaged from the joining member 13 following the reversed order shown in FIG. 4, FIG. 3 and FIG. 2 sequentially. It is noted that either the partition 12 or the joining member 13 is incapable of being detached from the computer casing 11 directly and independently.

The partition 12 of the computer casing 11 is primary for supporting the casing 11 against being deformed when the casing 11 is loaded with heavy objects such as data storage devices. Although the casing 11 has been reinforced with the partition 11, the partition 12 and the joining member 13 have to be detached from casing 11 together before repair or parts replacing can be started. In other words, the partition 12 has to be taken out from the casing 11 before being detached from the joining member 13 in case of the data storage devices mounted to the joining member 13 needed to repair or replaced. Hence, the structure of the partition 12 of the conventional computer casing 11 is incapable of allowing the joining member 13 disengaging from the partition 12 under a condition of the partition 12 keeping staying with the computer casing 11 and it results in the parts attached to the joining member 13 being inconvenient in case of parts repair or replacing being needed.

SUMMARY OF THE INVENTION

A primary object of the present invention is to provide a partition structure of a computer casing with which the preceding joining member is assembled to or disassembled from the partition easily.

A further object of the present invention is to provide a partition structure of a computer casing with which the joining member is capable of detached from the partition under a condition of the partition staying with the computer casing.

BRIEF DESCRIPTION OF THE DRAWINGS

The detail structure, the applied principle, the function and the effectiveness of the present invention can be more fully understood with reference to the following description and accompanying drawings, in which:

FIG. 8 is a plan view illustrating the partition and the joining member in the first embodiment starting being assembled with the first and the second assembling ways;

FIG. 9 is a plan view illustrating the partition and the joining member in the first embodiment having been assembled completely with the first and the second assembling ways;

FIG. 10 is a plan view illustrating the partition and the joining member in the first embodiment starting being assembled with the third assembling way;

FIG. 11 is a plan view illustrating the partition and the joining member in the first embodiment in the process of being assembled with the third assembling way;

FIG. 12 is a plan view illustrating the partition and the joining member in the first embodiment starting being assembled with the fourth assembling way;

FIG. 13 is a plan view illustrating the partition and the joining member in the first embodiment in the process of being assembled with the fourth assembling way;

FIG. 18 is a plan view illustrating the partition and the joining member in the second embodiment starting being assembled with the first and the second assembling ways;

FIG. 19 is a plan view illustrating the partition and the joining member in the second embodiment having been assembled completely with the first and the second assembling ways;

FIG. 20 is a plan view illustrating the partition and the joining member in the second embodiment starting being assembled with the third assembling way;

FIG. 21 is a plan view illustrating the partition and the joining member in the second embodiment in the process of being assembled with the third assembling way;

FIG. 22 is a plan view illustrating the partition and the joining member in the second embodiment starting being assembled with the fourth assembling way;

FIG. 23 is a plan view illustrating the partition and the joining member in the second embodiment in the process of being assembled with the fourth assembling way;

FIG. 24 is a plan view illustrating the partition and the joining member in the second embodiment in the process of being assembled with the third and the fourth assembling way;

FIG. 25 is a plan view illustrating the partition and the joining member in the second embodiment having been assembled completely with the third and the fourth assembling way;

DETAILED DESCRIPTION OF THE INVENTION

Figure 1:
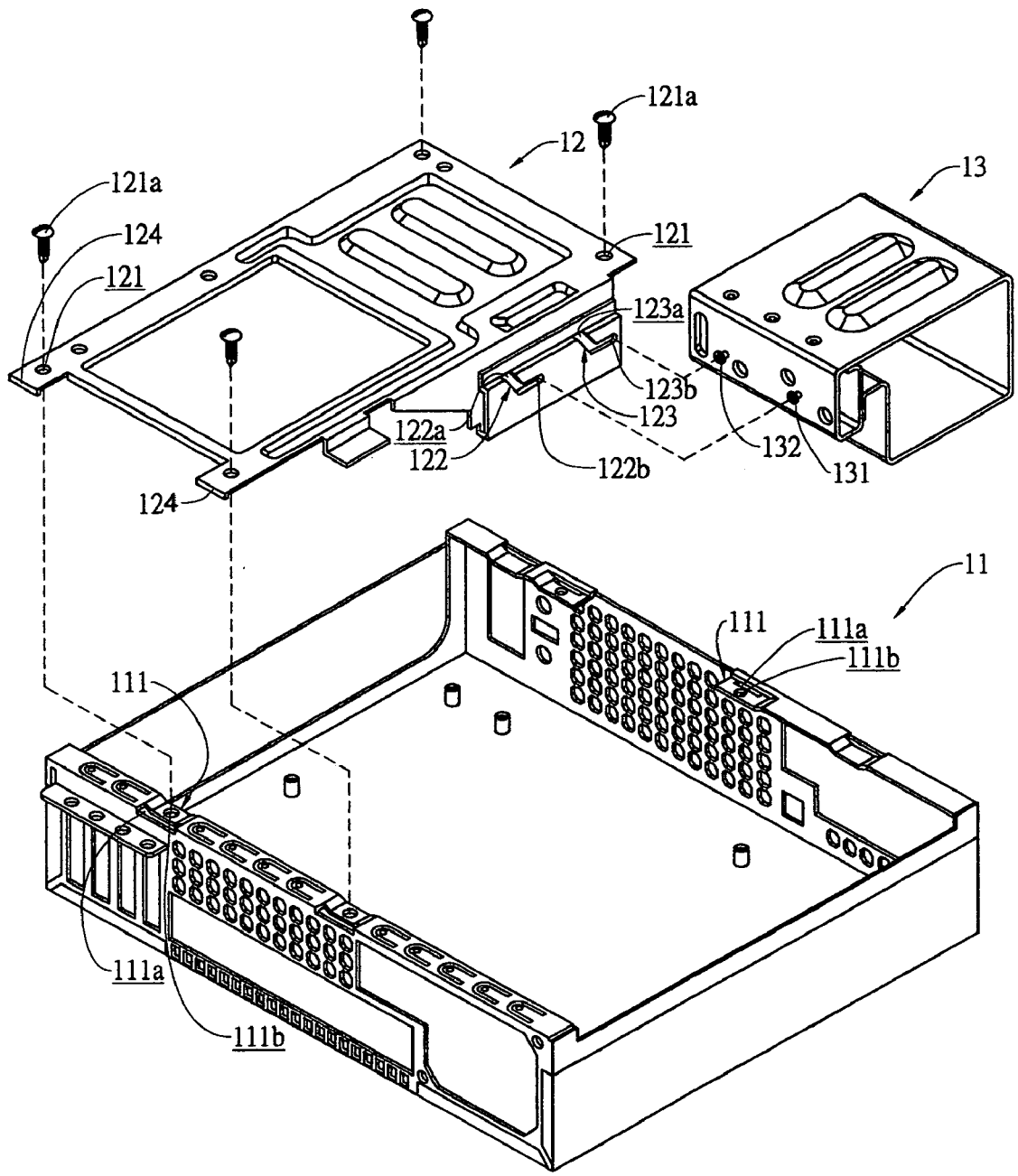
FIG. 1 is an exploded perspective view of a conventional computer casing with partition and joining member thereof.
Figure 2:
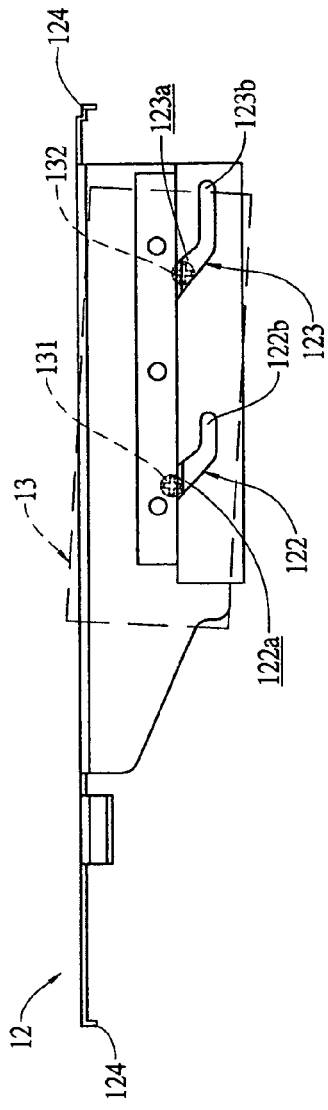
FIG. 2 is a plan view illustrating the conventional partition and joining member shown in FIG. 1 starting being assembled.
Figure 3:
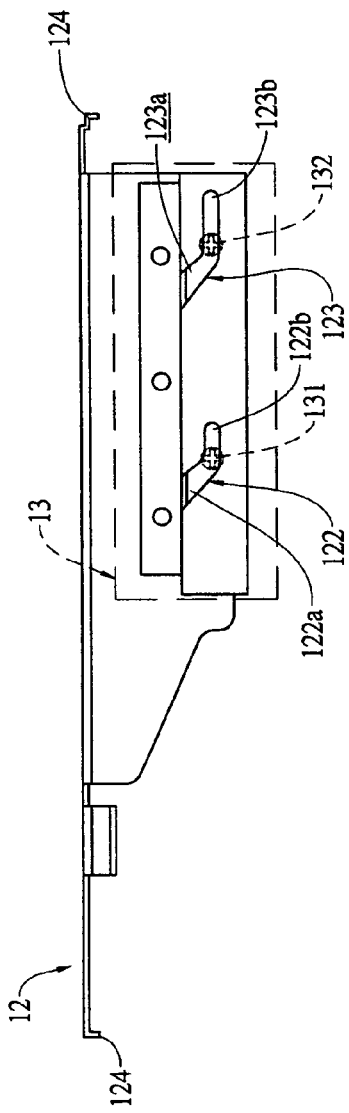
FIG. 3 is a plan view illustrating the conventional partition and joining member shown in FIG. 1 being in the process of assembling.
Figure 4:
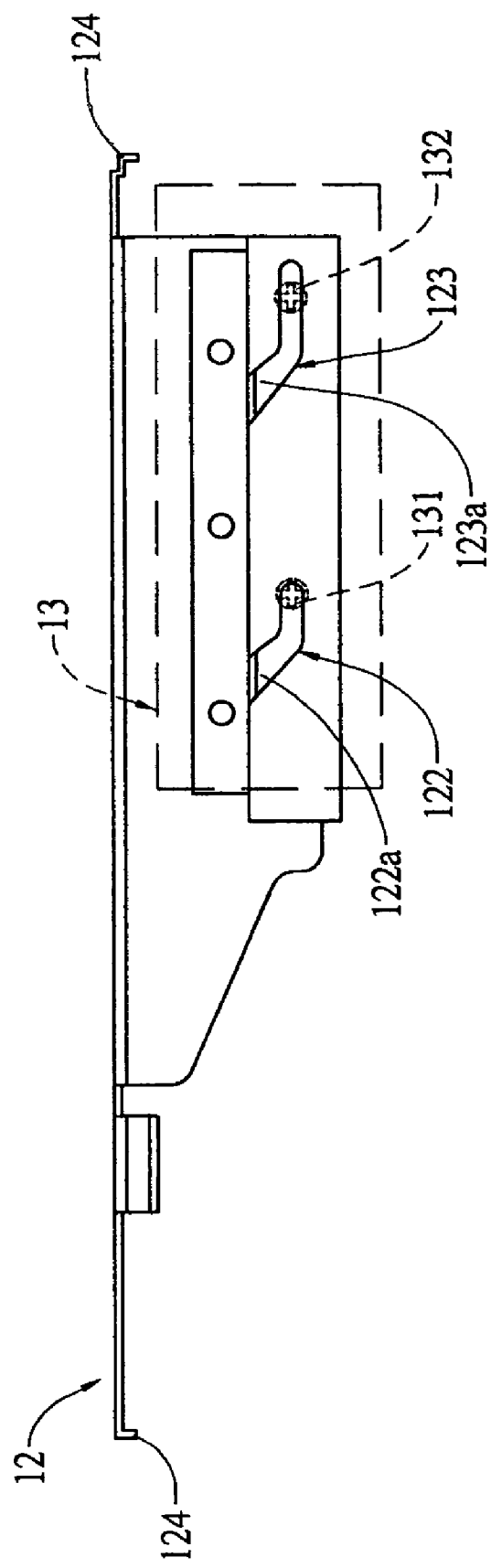
FIG. 4 is a plan view illustrating the conventional partition and joining member shown in FIG. 1 having been assembled completely.
Figure 5:
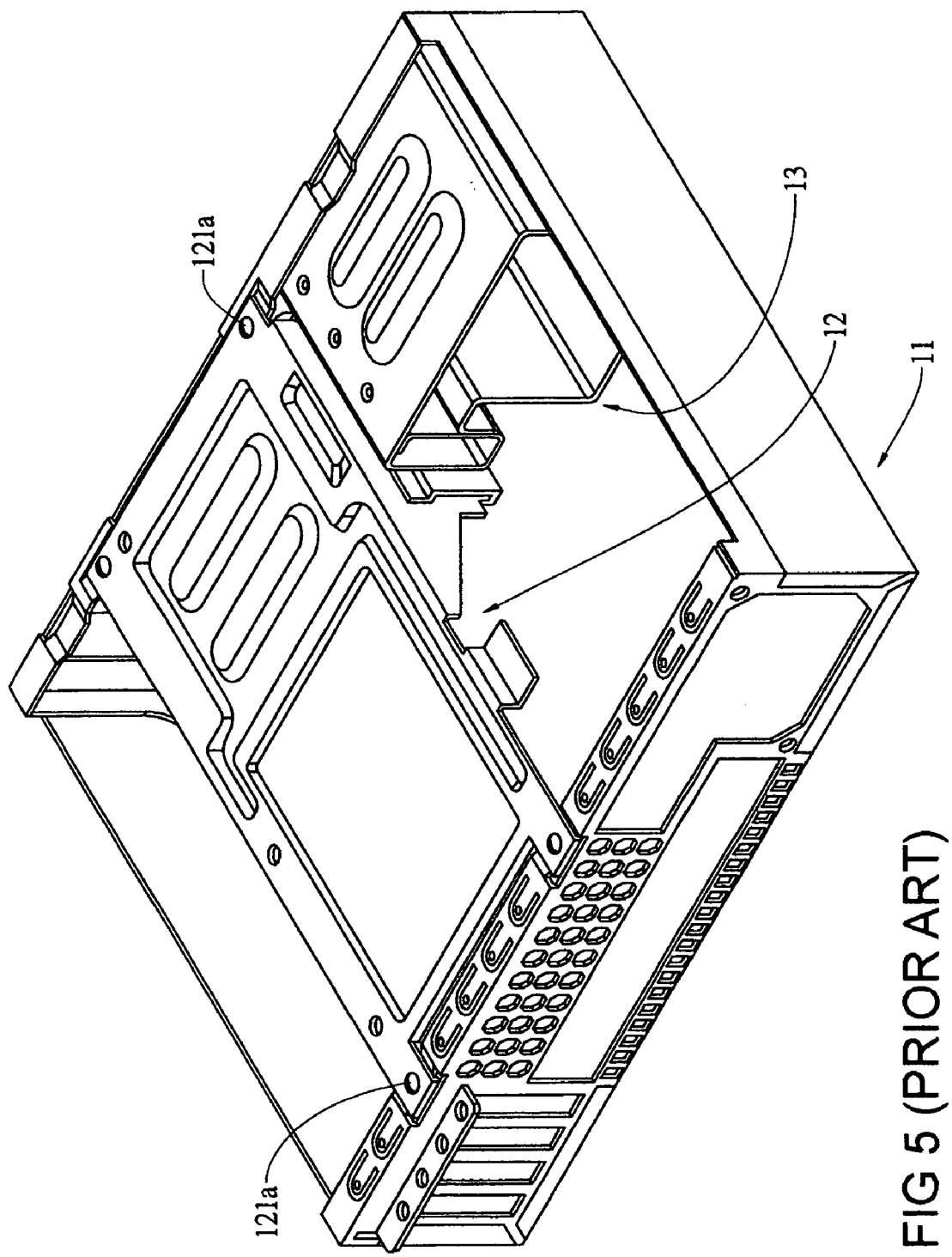
FIG. 5 is an assembled perspective view of the conventional computer casing, the partition and the joining member shown in FIG. 1.
Figure 6:
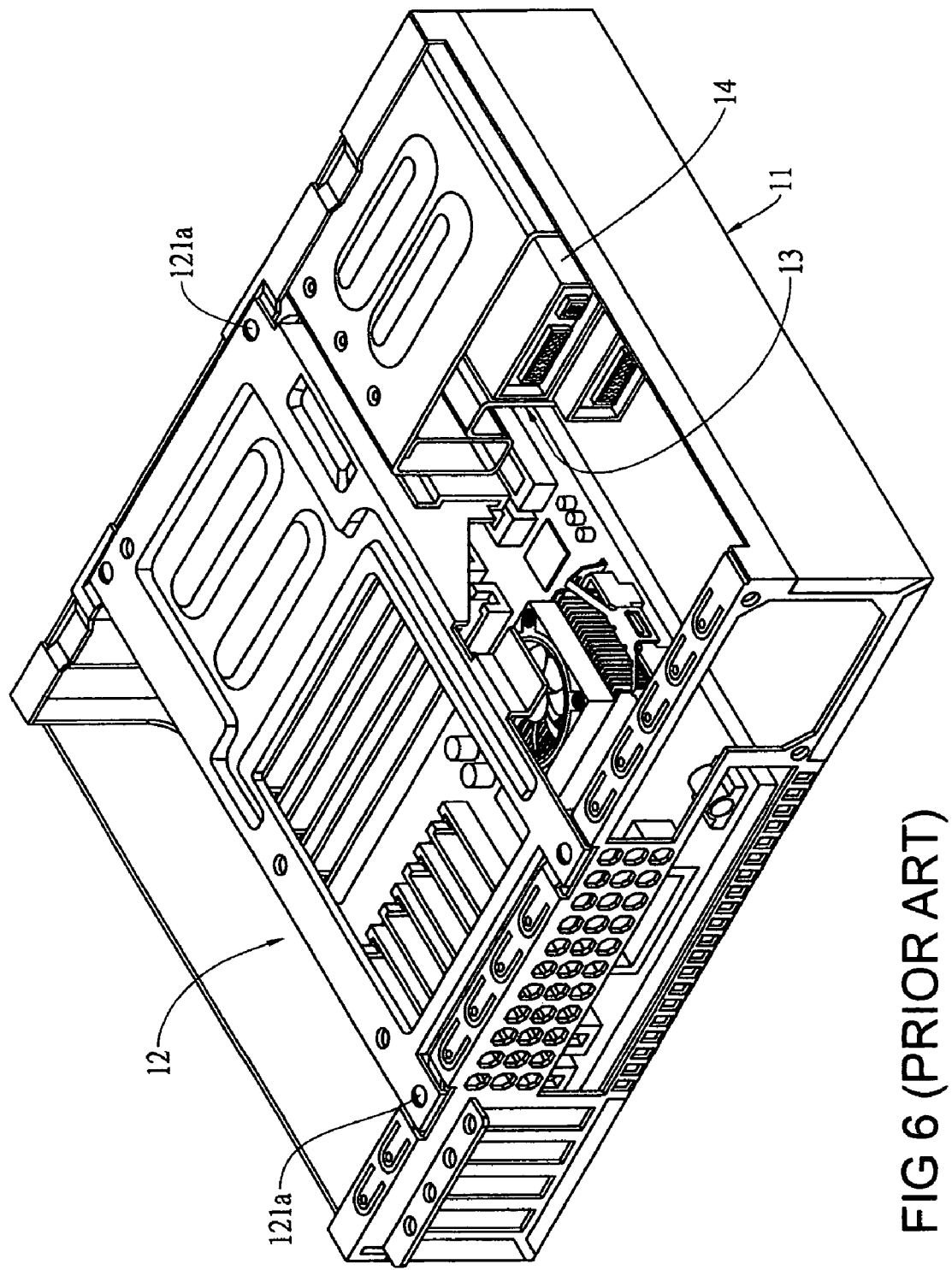
FIG. 6 is another assembled perspective view of the conventional computer casing, the partition and the joining member shown in FIG. 1.
Figure 7:
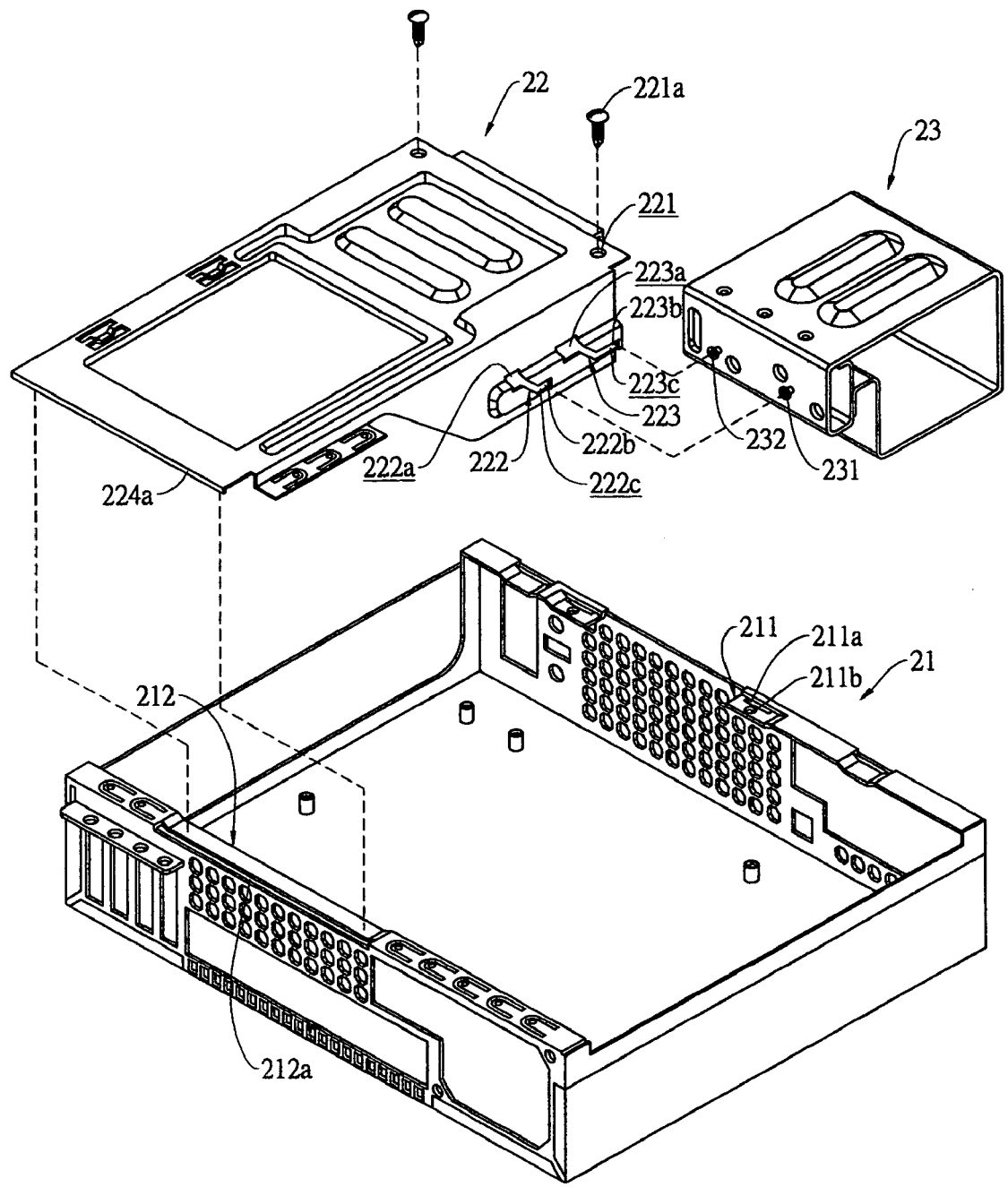
FIG. 7 is an exploded perspective view of the first embodiment of computer casing with partition and joining member thereof according to the present invention.

Referring to FIG. 7, the first embodiment of the partition structure of a computer casing according to the present invention includes a computer casing 21, a partition 22 and a joining member 23. The casing 21 has a fixing part 211 and a second fixing part 212 at two opposite sides. The first fixing part 211 has two locating slots 211a and two fixing holes 211b and the second fixing part 212 has an elongated locating slot 212a. The partition 22 has two perforations 221 for fasteners 221a passing through to engage with the fixing holes 211b such that the partition 22 can be fixedly attached to the casing 21 by means of the fasteners 221a.

The partition 22 has a first slant guide groove 222 and a second slant guide groove 223 at a lateral wall thereof. The first slant guide groove 222 further has a first upper horizontal guide groove part 222a at the upper end thereof, a first lower horizontal guide groove part 222c at the lower end thereof and a first locating part 222b at the end of the first lower horizontal guide groove part 222b. The second slant guide groove 223 further has a second upper horizontal guide groove part 223a at the upper end thereof, a second lower horizontal guide groove part 223c at the lower end thereof and a second locating part 223b at the end of the second lower horizontal guide groove part 223c. A joining member 23 is provided with two engaging parts 231, 232 at a lateral side thereof corresponding to the first slant guide groove 222 and the second slant guide groove 223 respectively. The engaging parts 231, 232 can engage with the locating parts 222b, 223b via entering the first upper horizontal guide groove part 222a or the first lower horizontal guide groove part 222c of the first slant guide groove 222 and entering the second upper horizontal guide groove part 223a or the second lower horizontal guide groove part 223c of the second guide groove 223 respectively. It can be seen in the figures that the first upper, horizontal guide groove part 222a and the first lower horizontal guide groove 222c are shorter than the second upper horizontal guide groove part 223a and the second lower guide groove part 223c respectively. It also can be seen that the first upper horizontal guide grove part 222a and the first lower horizontal guide groove part 222c are wider than rest part of the slant guide groove 222 and the second upper horizontal guide groove part 223a and the second lower horizontal guide groove part 223c are wider than rest part of the second slant guide groove 223. The preceding specific structure of the partition 22 is arranged for facilitating the joining member 23 being assembled to or disassembled from the partition 22 easily and handily.

Figure 15:
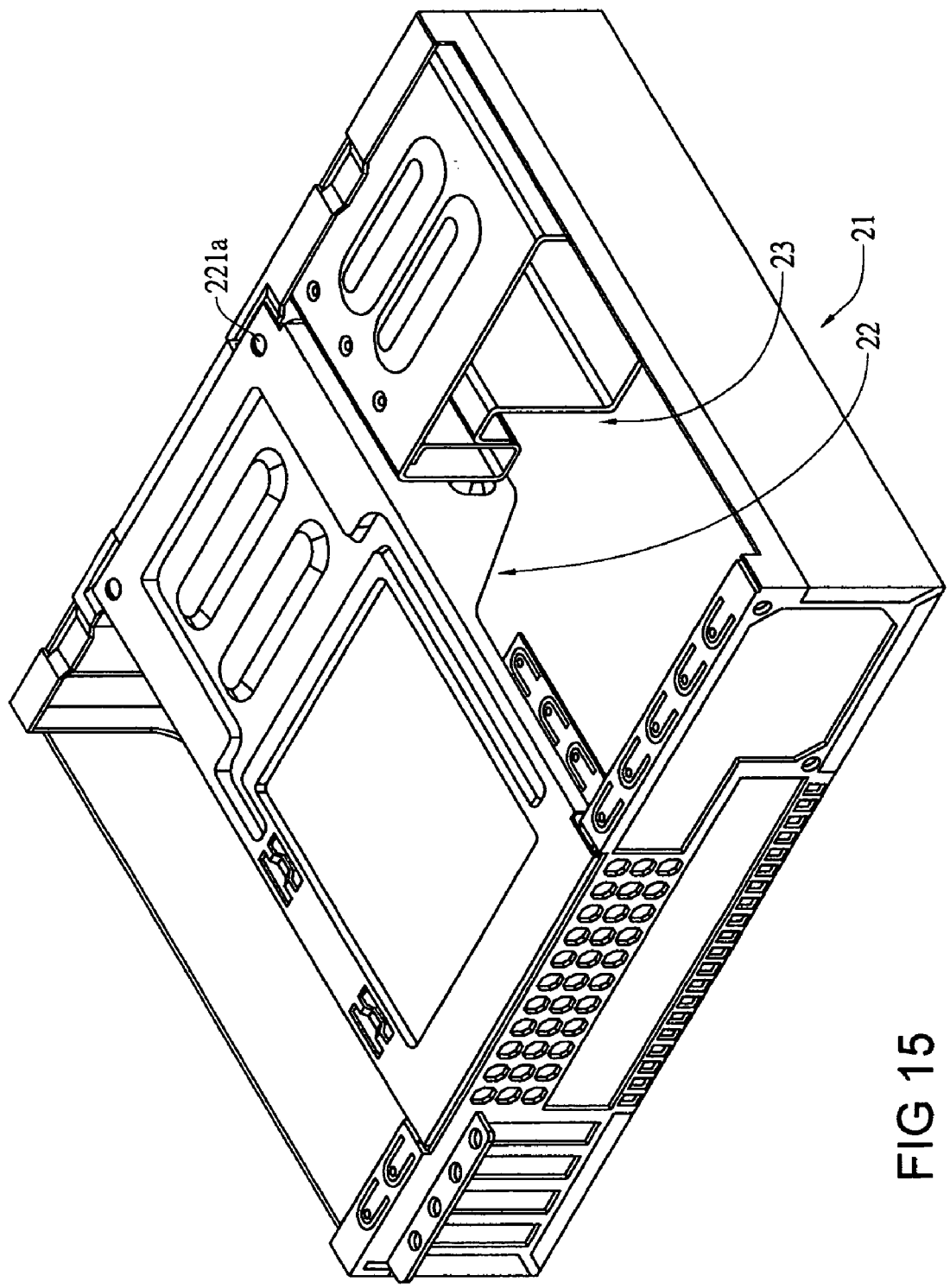
FIG. 15 is an assembled perspective view of the first embodiment of the computer casing with the partition and the joining member shown in FIG. 7.

Referring to FIGS. 8, 9 and 15, the first assembling way of the present embodiment is illustrated. The joining member 23 is moved to the partition 22 first and then the first lower horizontal guide groove part 222c of the first guide groove 222 and the second lower horizontal guide groove part 223c of the second guide rail 223 are moved downward from the top of the engaging parts 231, 232 of the joining member 23 to allow the engaging parts 231, 232 entering the first guide groove 222 and the second guide groove 223 from the first lower horizontal guide groove part 222c of the first guide groove 222 and the second lower horizontal groove part 223c of the second guide groove 223. Next, the first locating part and the second locating part 222b, 223b are joined to the engaging part 231 and the engaging part 232 respectively. In the meantime, the projections 224a, 224b at both end sides of the partition 22 fit with the locating slots 212a, 211a of the casing 21 respectively. Further, the fasteners 221a pass through the perforations 221 of the partition 22 to engage with the fixing holes 211b such that the partition 22 can be fixedly attached to t casing 21 by way of the fasteners 221a. When the partition 22 is detached from the casing 21, the fasteners 221a are unfastened first and then the partition 22 is detached from the joining member 23 independently via reversed order from FIG. 9 to FIG. 8.

The second assembling way of the present embodiment is done with the projections 224a, 224b of the partition 22 inserting into the slots 212a, 211a of the casing 21 first. Then, the fasteners 221a pass through the perforations 221 of the partition 22 to engage with the fixing holes 211b such that the partition 22 can be attached to the casing 21. Next, the engaging parts 231, 232 of the joining member 23 enter the slant guide groove 222 via the first lower horizontal guide groove part 222c of the first guide groove 222 and the second lower horizontal guide groove part 223c of the second guide groove 223. Further, the engaging parts 231, 232 slide to the first and second locating parts 222b, 223b along the first slant guide groove 222 and the second slant guide groove 223 respectively. When the joining member 23 is disengaged from the partition 22 the joining member 23 is detached from the partition 22, from the partition 22 via the reversed order from FIG. 9 to FIG. 8.

Figure 14:
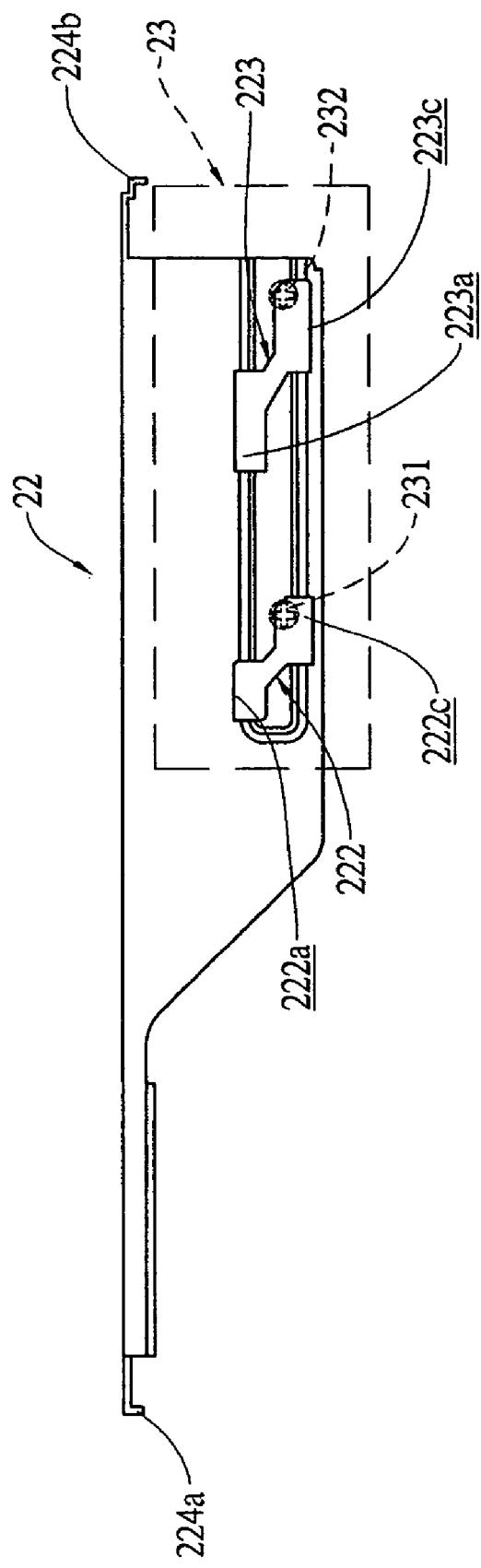
FIG. 14 is a plan view illustrating the partition and the joining member in the first embodiment having been assembled completely with the third and the fourth assembling ways.

Referring to FIGS. 10, 11 and 14 in company with FIG. 15, the third assembling way of the present embodiment is illustrated. The joining member 23 is moved to the casing 21 first. Then, the partition 22 is tilted an angle and the first upper horizontal guide groove part 222*a* of the first slant guide groove 222 and the second upper horizontal guide groove part 223*a* of the second slant guide groove 223 are moved upward from the bottom of the engaging parts 231, 232 of the joining member 23 to allow the engaging parts 231, 232 entering the first slant guide groove part 222 and the second slant guide groove 232 via the first upper horizontal guide groove part 222*a* of the first guide groove 222 and the second upper horizontal guide groove part 232*a* of the second guide groove 232. Further, the locating parts 222*b*, 223*b* of the first slant guide groove 222 and the second slant guide groove 232 engage with the engaging parts 231, 232 of the joining member 23 respectively. In the meantime, the projections 224*a*, 224*b* on the partition 22 fit with the locating slots 212*a*, 211*a* of the casing 21. Further, the fasteners 221*a* pass through the perforations 221 of the partition 22 to engage with the fixing holes 211*b* such that the partition 22 is fixedly attached to the casing 21 by means of the fasteners 221*a*. When the partition 22 is detached from the casing 21, the fasteners 221*a* are loosened and the partition 22 can be detached from the joining member 23 separately via the reversed order from FIG. 14 to FIG. 11 and to FIG. 10.

Referring to FIGS. 12 and 13 in company with FIGS. 14 and 15, the fourth assembling way of the present embodiment is illustrated. The projections 224*a*, 224*b* of the partition 22 are arranged to fit with the locating slots 212*a*, 211*a* of the casing 21 first. Then, the fasteners 221*a* pass through the perforations 221 of the partition 22 to engage with the fixing holes 211*b* such that the partition 22 can be fixedly attached to the casing 21. Next, the engaging parts 231, 232 of the joining member 23 enter the first slant guide groove 222 and the second slant guide groove 223 via the first lower horizontal guide groove part 222*c* of the first slant guide groove 222 and the second lower horizontal guide groove part 223*c* of the second slant guide groove 223. Further, the engaging parts 231, 232 slide to the first and second locating parts 222*b*, 223*b* along the first slant guide groove 222 and the second slant guide groove 223 respectively. When the joining member 23 is disassembled, the joining member 23 is detached from the partition 22 via the reversed order from FIG. 14 to FIG. 12.

Figure 17:
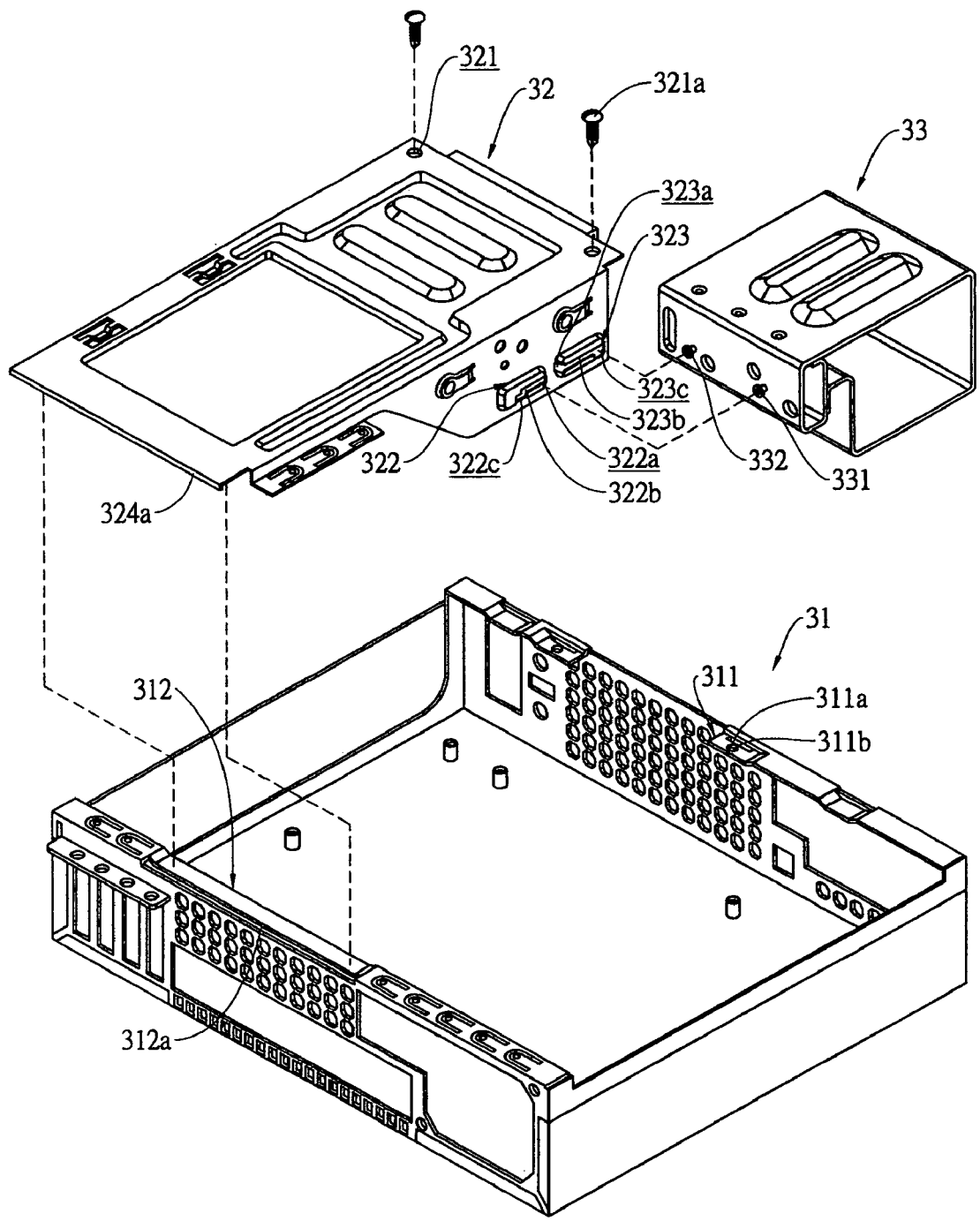
FIG. 17 is an exploded perspective view of the second embodiment of computer casing with partition and joining member thereof according to the present invention.

Referring to FIG. 17, the second embodiment of the present invention is illustrated. Similar to the first embodiment, the partition structure of a computer casing in the second embodiment comprises a computer casing 31, a partition 32 and a joining member 33 too. The casing has a fixing part 311 and a second fixing part 312 at two opposite side walls of the computer casing 31. The first fixing part 311 has two locating slots 311*a* and two fixing holes 311*b* and the second fixing part 312 has an elongated slot 312*a*. The partition 32 has two perforations 321 corresponding to the fixing holes 311*b* for being passed through with fasteners 321*a* to engage with the fixing holes 311*b* such that the partition 32 is able to be fixedly attached to the casing 31.

The partition 32 has a first horizontal guide groove 322 and a second horizontal guide groove 323 at a lateral wall thereof. The first horizontal guide groove 322 further has a first upper opening 322*a* at an end thereof, a first lower opening 322*c* extending downward from the other end thereof and a first locating part 322*b* at the upper edge thereof. The second guide rail 323 further has a second upper opening 323*a* at an end thereof opposite to the first opening 322*a*, a second opening 323*c* extending downward from the other end thereof and a second locating part 323*b* being disposed at the upper edge thereof. Thus, the joining member 33, which is provided with engaging parts 331, 332, can engage with the first and second locating parts 322*b*, 323*b* via the first upper opening 322*a* or the first lower opening 322*c* of the first horizontal guide groove 322 and via the second upper opening 323*a* or the second lower opening 323*c* of the second horizontal guide groove 323. It can be seen in the figures that the first horizontal guide groove 322 is shorter than the second horizontal guide groove 323 and that the first upper opening 322*a* and the first lower opening 322*c* are wider than rest part of the first horizontal guide groove 322 and the second upper opening 323*a* and the second lower opening 323*c* is wider than rest part of the second horizontal guide groove 323. The preceding specific structure of the partition 32 is arranged for facilitating the joining member 23 being assembled to or disassembled from the partition 32 easily and handily.

Figure 26:
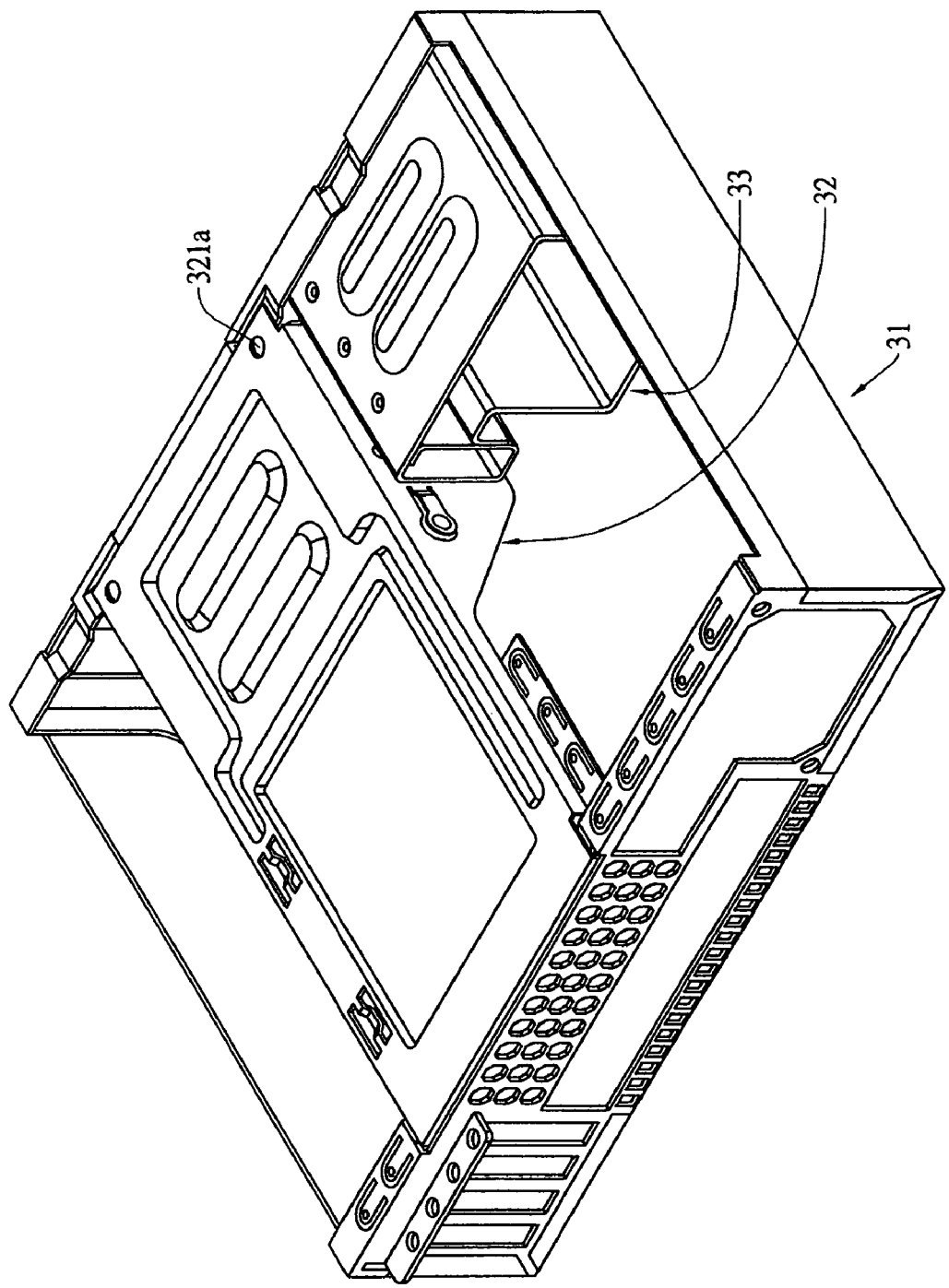
FIG. 26 is an assembled perspective view of the second embodiment of the computer casing with the partition and the joining member shown in FIG. 17.
Figure 27:
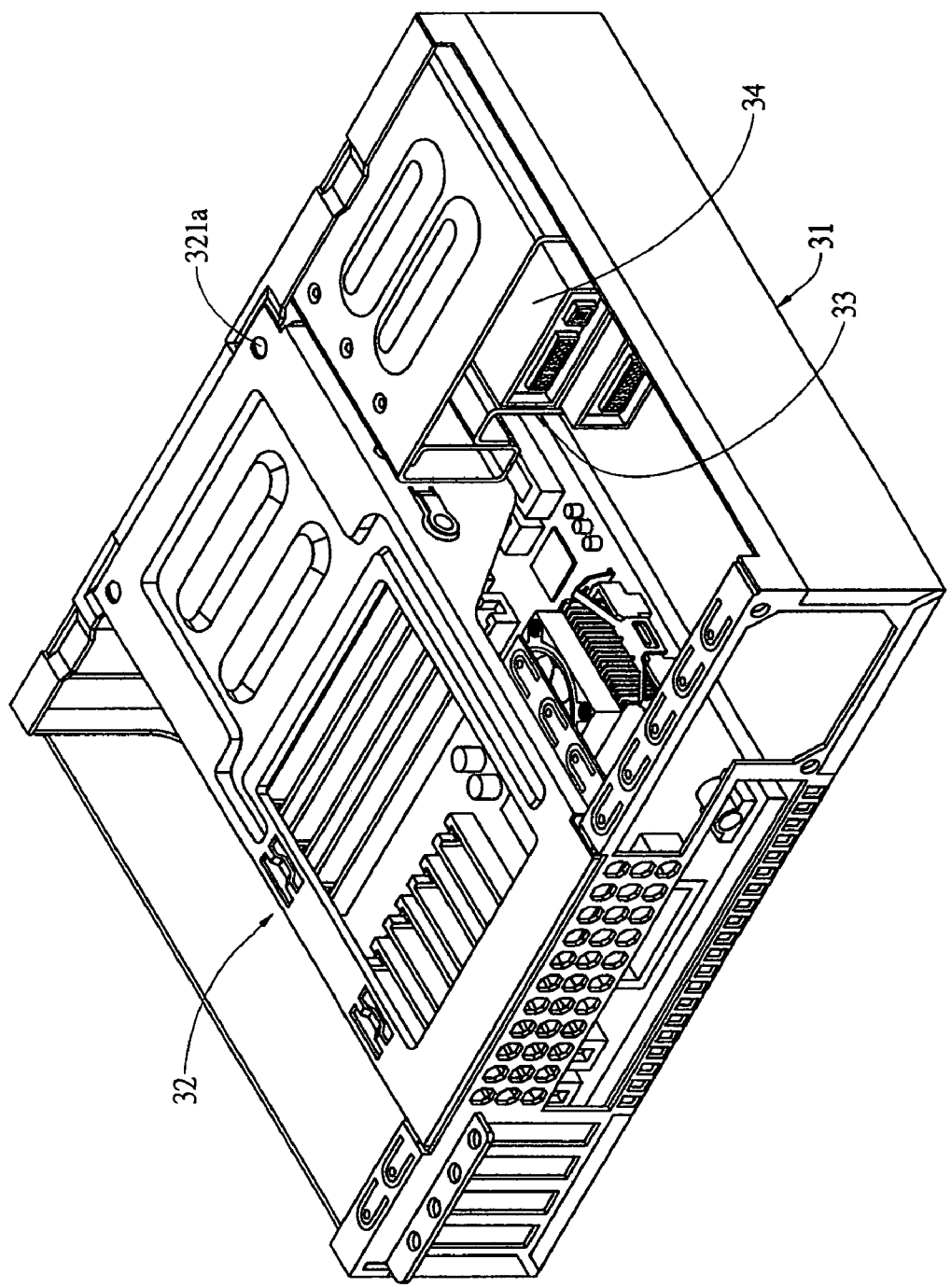
FIG. 27 is another assembled perspective view of the second embodiment of the computer casing with the partition and the joining member shown in FIG. 17.

Referring to FIGS. 18, 19 and 26, the first assembling way of the present embodiment is illustrated. The joining member 33 is moved to the casing 31 first and then the first lower opening 322*c* of the first horizontal guide groove 322 and the second lower opening 323*c* of the second horizontal guide groove 323 are moved downward from the top of the engaging parts 331, 332 of the joining member 33 to allow the engaging parts 331, 332 entering the first horizontal guide groove 322 and the second horizontal guide groove 323 from the second lower opening 322*c* of the first horizontal guide groove 222 and the second lower opening 323*c* of the second guide groove 323. Next, the first and second locating parts 322*b*, 323*b* of the first horizontal guide groove 322 and the second horizontal guide groove 323 are joined to the engaging part 331 and the engaging part 332 respectively. In the meantime, the projections 324*a*, 324*b* on the partition 32 fit with the locating slots 312*a*, 311*a* of the casing 21 respectively. Further, the fasteners 321*a* pass through the perforations 321 of the partition 32 to engage with the fixing holes 311*b* such that the partition 32 is fixedly attached to the casing 31 firmly. When the partition 32 is detached from the casing 31, the fasteners 321*a* are loosened first and the partition 32 is detached from the joining member 23 independently via reversed order from FIG. 19 to FIG. 18.

The second assembling way of the present embodiment is to insert the projections 324*a*, 324*b* of the partition 32 into the slots 312*a*, 311*a* of the casing 31 first. Then, the fasteners 321*a* pass through the perforations 321 of the partition 32 to engage with the fixing holes 311*b* such that the partition 32 is attached to the casing 31. Next, the engaging parts 331, 332 of the joining member 33 enter the first horizontal guide groove 322 and the second horizontal guide groove 323 via the first lower opening 322*c* of the first horizontal guide groove 322 and the second lower opening 323*c* of the second horizontal guide groove 323. Further, the engaging parts 331, 332 slide to the locating parts 322*b*, 323*b* along the first horizontal guide groove 322 and the second horizontal guide groove 323 respectively. When the joining member 33 is disassembled, the joining member 33 is detached from the partition 32 via reversed order from FIG. 19 to FIG. 18.

Referring to FIGS. 20, 21, 24, 25 and 26, the third assembling way of the present embodiment is illustrated. The joining member 33 is moved to the casing 31 first. Then, the partition 32 is tilted an angle and the first opening 322a of the first horizontal guide groove 322 and the second opening 323a of the second horizontal guide groove 323 move upward from the bottom of the engaging parts 331, 332 of the joining member 33 to allow the engaging parts 231, 232 entering the first horizontal guide groove 322 and the second horizontal guide groove 332 via the first opening 322a of the first horizontal guide groove 322 and via the second opening 332a of the second horizontal guide groove 332. Further, the first and second locating parts 322b, 323b of the first horizontal guide groove 322 and the second horizontal guide groove 232 engage with the engaging parts 331, 332 of the joining member 33 respectively. In the meantime, the projections 324a, 324b on the partition 32 fit with the locating slots 312a, 311a of the casing 31. Further, the fasteners 321a pass through the perforations 321 of the partition 32 to engage with the fixing holes 311b such that the partition 32 is fixedly attached to the casing 31. When the partition 32 is disassembled from the casing 31, the fasteners 321a are loosened first and the partition 32 is detached from the joining member 23 independently via reversed order from FIG. 25, FIG. 24, FIG. 21 and FIG. 20 sequentially.

Referring to FIGS. 22, 23 in company with FIGS. 24, 25 and 26, the fourth assembling way of the present embodiment is illustrated. The projections 324a, 324b of the partition 32 fit with the locating slots 312a, 311a of the casing 31 first. Then, the fasteners 321a pass through the perforations 321 of the partition 32 to engage with the fixing holes 311b such that the partition 32 is attached to the casing 31 by means of the fasteners 321a. Next, the engaging parts 331, 332 of the joining member 33 enter the first horizontal guide groove 322 and the second horizontal guide groove 323 via the first opening 322a of the first horizontal guide groove 322 and the second opening 323a of the second horizontal guide groove 323. Further, the engaging parts 331, 332 slide to the first and second locating part 322b, 323b along the first horizontal guide groove 322 and the second horizontal guide groove 323 respectively. When the joining member 33 is disassembled, the joining member 33 is removed independently from the partition 32 via reversed order from FIG. 25, FIG. 24, FIG. 23 and FIG. 22 sequentially.

It is appreciated that contrast to the prior art, the present invention has the following advantages:

1. The partition 22, 32 of a computer casing 21, 31 according to the present invention can support the computer casing 21, 31 against being deformed by heavy load in case of the computer casing 21, 31 supports heavy parts.

Figure 16:
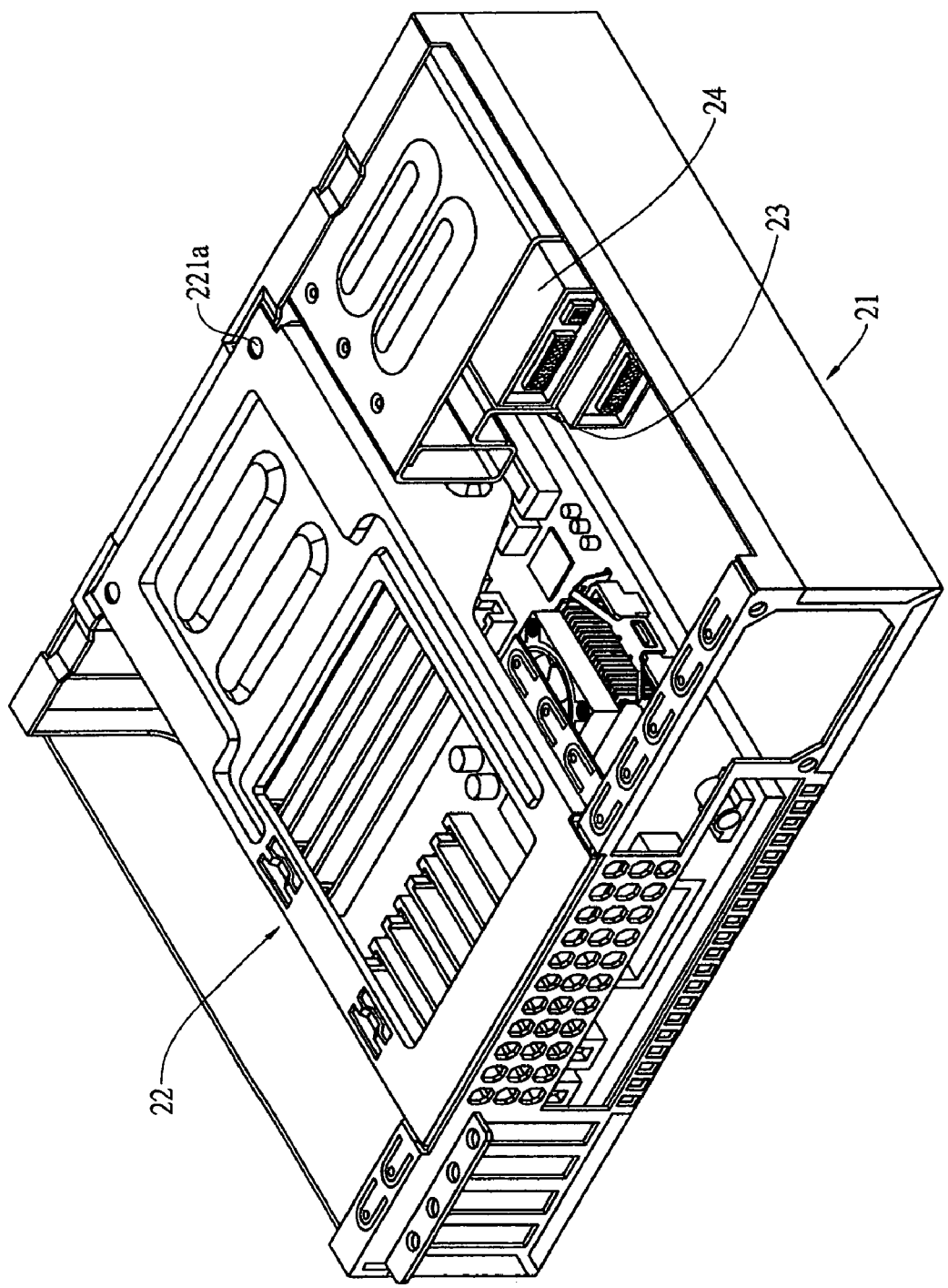
FIG. 16 is another assembled perspective view of the first embodiment of the computer casing with the partition and the joining member shown in FIG. 7.

2. In addition to the partition 22, 32 reinforcing the structural strength of the computer casing 21, 31, it is not necessary to detach the partition 22, 32 and the joining member 23, 33, which is attached with the storage device as shown in FIG. 16, from the computer casing 21, 31 at the same time for repair or replacing part. Hence, the partition 22, 32 of the present invention allows repair or part replacing job being done easily and facilitates the joining member 23, 33 being assembled or disassembled conveniently.

While the invention has been described with referencing to preferred embodiments thereof, it is to be understood that modifications or variations may be easily made without departing from the spirit of this invention, which is defined by the appended claims.

What is claimed is:

1. A petition structure of a computer casing, comprising:
a casing, providing a first fixing part with two short cut openings and two fixing holes at a side thereof and a second fixing part with a long cut opening;
a partition, providing short projections at an end side thereof inserting into the short cut openings and a long projection at another end side thereof inserting into the long cut opening and providing two perforations corresponding to the two fixing holes so as to being fastened to the casing by way of fasteners engaging with the perforations and the fixing holes respectively;
a joining member, providing a first engaging part and a second engaging part at a side thereof;
characterized in that a lateral side of the partition has a first slant guide groove and a second slant guide groove corresponding to the first engaging part and the second engaging part respectively and the first slant guide groove has a first upper horizontal groove part at the upper end thereof, a first lower horizontal groove part at the lower end thereof and a locating part at an end of the first lower horizontal groove part and the second slant guide groove has a second upper horizontal groove part at the upper end thereof, a second lower horizontal groove part at the lower end thereof and a second locating part at an end of the second lower horizontal groove; the first upper horizontal groove part and the first lower horizontal part are wider than rest part of the first slant guide groove and the second upper horizontal groove part and the second lower horizontal groove part are wider than rest part of the second slant guide groove; and the first upper and lower horizontal groove parts are shorter than the second upper and lower horizontal groove parts.

2. A petition structure of a computer casing, comprising:
a casing, providing a first fixing part with two short cut openings and two fixing holes at a side thereof and a second fixing part with a long cut opening;
a partition, providing short projections at an end side thereof inserting into the short cut openings and a long projection at another end side thereof inserting into the long cut opening and providing two perforations corresponding to the two fixing holes so as to being fastened to the casing by way of fasteners engaging with the perforations and the fixing holes respectively;
a joining member, providing a first engaging part and a second engaging part at a side thereof;
characterized in that a lateral side of the partition provides a first horizontal guide groove and a second horizontal guide groove corresponding to the first engaging part and the second engaging part respectively; the first horizontal guide groove has a first upper opening at an end thereof, a first lower opening extending downward from another end thereof and a locating part at the upper edge thereof; the second horizontal guide groove has a second upper opening at an end thereof, a second lower opening extending downward from another end thereof and a second locating part at the upper edge thereof; the first upper opening is disposed opposite to the second upper opening; the first upper and lower openings are wider than rest part of the first horizontal guide groove and the second upper and lower openings are wider than rest part of the second horizontal guide groove; and the first horizontal guide groove is shorter than the second horizontal guide groove.

* * * * *